United States Patent [19]
Chowdhary et al.

[11] Patent Number: 6,148,433
[45] Date of Patent: Nov. 14, 2000

[54] SYSTEMATIC APPROACH FOR REGULARITY EXTRACTION

[75] Inventors: Amit Chowdhary, Sunnyvale; Sudhakar S. J. Kale, San Jose; Phani K. Saripella; Naresh K. Sehgal, both of Santa Clara; Rajesh K. Gupta, Irvine, all of Calif.

[73] Assignee: Intel Corporation, Santa Clara, Calif.

[21] Appl. No.: 09/187,543

[22] Filed: Nov. 6, 1998

[51] Int. Cl.[7] ................................................. G06F 17/50
[52] U.S. Cl. ................................................. 716/1; 716/8
[58] Field of Search .................... 395/500.19, 500.18, 395/500.01, 500.02; 716/1, 8

[56] References Cited

U.S. PATENT DOCUMENTS

| | | | |
|---|---|---|---|
| 5,627,999 | 5/1997 | Cheng et al. | 395/500 |
| 5,737,237 | 4/1998 | Tanaka et al. | 364/491 |
| 5,898,595 | 4/1999 | Bair et al. | 364/491 |
| 5,910,898 | 4/1999 | Johannsen | 364/489 |
| 5,991,524 | 11/1999 | Belkhale et al. | 395/500.19 |
| 6,031,980 | 2/2000 | Oota | 395/500.09 |

OTHER PUBLICATIONS

S.D. Rao et al., An Approach to Scheduling and Allocation using Regularity Extraction, 4th European Conference on Design Automation, pp. 557–561, Feb. 1993.

A. Chowdary et al., A General Aproach For Regularity Extraction of Datapath Circuits, International Conference on Computer–Aided Design, pp. 332–339, Nov. 1998.

A Chowdhary et al., Extraction of Functional Regularity in Datapath Circuits, IEEE Transactions on Computer–Aided Design, pp. 1279–1296, Sep. 1999.

S.R. Arikati and R. Varadarajan. "A Signature Based Approach to Regularity Extraction". In Proceedings of International Conference on CAD, pp. 542–545, Nov. 1997.

A. Chowdhary and J.P. Hayes. "Technology Mapping for Field–Programmable Gate Arrays Using Integer Programming". In Proc. Int'l. Conf. on CAD, pp. 346–352. Nov. 1995.

M.R. Corazao, et al. "Performance Optimization Using Template Mapping for Datapath–Intensive High–Level Synthesis". *IEEE Trans. on CAD,* 15(8): 877–888. Aug. 1996.

D.W. Dobberpuhl. "Circuits and Technology for Digital's StrongARM and ALPHA Microprocessors". In Proc. Conf. on Advanced Research in VLSI, pp. 2–11, Sep. 1997.

E. Detjens et al. "Technology Mapping in MIS". In Proc Int'l Conf. on CAD, pp. 116–119, 1987.

R. Gupta and S. Liao. "Using a Programming Language for Digital System Design". *IEEE Design and Test of Computers,* pp. 72–80, Apr. 1997.

(List continued on next page.)

*Primary Examiner*—Paul R. Lintz
*Assistant Examiner*—Annette M. Thompson
*Attorney, Agent, or Firm*—Alan K. Aldous

[57] ABSTRACT

In some embodiments, the invention includes a method of regularity extraction including generating a set of templates for a circuit through computer automated operations on a description of the circuit. The method also includes covering the circuit with instances of a subset of the templates. In some embodiments, the set of templates includes single-principal output templates, where a single-principal output templates is a template in which all outputs of the template are in the transitive fanin of a particular output of the template. The set of templates may also include tree templates. In some embodiments, the set of templates is a complete set of templates given certain assumptions including that the set of templates include all maximal templates of involved classes of templates and a template is not generated through permuting gate inputs. In some embodiments, the covering of the circuit involves selecting one of the set of templates and meeting certain criteria and deleting all nodes in instances of the selected template. The covering may further include deleting the templates in the set of templates other than the selected templates and regenerating a new set of templates from the remaining uncovered circuit.

28 Claims, 11 Drawing Sheets

OTHER PUBLICATIONS

M.C. Hansen and J.P. Hayes. "High–Level Test Generation Using Physically–Induced Faults". In Proc. VLSI Test Symp., pp. 20–28, May 1995.

M. Hirsch and D. Siewiorek. "Automatically Extracting Structure From a Logical Design". In Proc. Int'l. Conf. on CAD, pp. 456–459, Nov. 1988.

K. Keutzer. "Dagon: Technology Binding and Local Optimization by DAG Matching". In Proc. 24th Design Automation Conf., pp. 341–347, Jun. 1987.

J. Li and R. Gupta. "HDL Code Restructuring Using Time Decision Tables". In Proc. 6th Int'l Workshop on Codesign, pp. 131–135, Mar. 1998.

G. Odawara, T. Hiraide, and O. Nishina. "Partitioning and Placement Technique for CMOS Gate Arrays". *IEEE Trans. on CAD,* 6(3): 355–363, May 1987.

J.M. Rabaey, C. Chu, P. Hoang and M. Potkonjak. "Fast Prototyping of Datapath–Intensive Architectures". *IEEE Design and Test of Computers,* pp. 40–51, Jun. 1991.

D. S. Rao ad F.J. Kurdahi. "On Clustering for Maximal Regularity Extraction". *IEEE Trans on CAD,* 12(8): 1198–1208, Aug. 1993.

H. Yalcin, J.P. Hayes, and K.A. Sakallah. "An Approximate Timing Analysis Method for Datapath Circuits". In Proc Int'l Conf. on CAD, pp. 114–118, Nov. 1996.

R.X.T. Nijssen and C.A.J. van Eijk. "Regular Layout Generation of Logically Optimized Datapaths". In Proc. Int'l Symp. on Physical Design. pp. 42–47, 1997.

R.X.T. Nijssen and C.A.J. van Eijk. "A Methodology For Utilizing Datapath Regularity in Stand Design Flows". In *Integration the VLSI Journal 25,* pp. 111–135, 1998, 11/1.

SYSTEMATIC APPROACH FOR REGULARITY EXTRACTION

BACKGROUND OF THE INVENTION

1. Technical Field of the Invention

The present invention relates to computer-aided design (CAD) and, more particularly, to regularity extraction in the design of integrated circuits.

2. Background Art

In high-performance custom integrated circuit designs, designers take advantage of the high degree of regularity often present in circuits to generate efficient layouts in terms of area and performance as well as to reduce the design effort. Datapath circuits perform various arithmetic and multiplexing operations on wide buses. Such circuits have a very high degree of regularity. The design effort can be reduced by identifying or extracting regularity in circuits, thus improving the productivity of designers. Currently, however, datapath circuits in general-purpose microprocessors are designed almost entirely by hand. Existing CAD tools can not extract and utilize regularity to the extent necessary for competitive designs.

Various techniques for extraction of functional regularity have been proposed in the literature. For example, D. S. Rao et al., "On clustering for maximal regularity extraction," IEEE Tran. on CAD of Integrated Circuits and Systems, Vol. 12, No. 8 (August 1993), pp. 1198–1208, describes a string matching algorithm to find all instances of user-specified templates in the circuit, and then heuristically choose a subset of the set of templates to cover the circuit. The final cover is sensitive to the templates provided by the designer. M. R. Corazao et al., "Performance optimization using template mapping for datapath-intensive high-level synthesis," IEEE Trans. on CAD of Integrated Circuits and Systems, Vol. 15, No. 8 (August 1996), pp. 877–887, also assumes that a template library is provided, but claims to generate all complete as well as partial instances of a given template in the circuit. Another approach described in R.X.T. Nijssen et. al., "Regular layout generation of logically optimized datapaths," Proc. Int'l Symp. on Physical Design, (1997), pp. 42–47, involves choosing small logic components, such as latches, as templates, and then growing them to obtain bigger templates. This approach is highly dependent on the initial choice of templates.

The approaches in the above-listed articles either rely on the user specified templates or generate templates in an incomplete and ad hoc manner. Opportunities for regularity extraction are missed.

Accordingly, there is a need for techniques for systematic regularity extraction.

SUMMARY

In some embodiments, the invention includes a method of regularity extraction including generating a set of templates for a circuit through computer automated operations on a description of the circuit. The method also includes covering the circuit with instances of a subset of the templates.

In some embodiments, the set of templates includes single-principal output templates, where a single-principal output templates is a template in which all outputs of the template are in the transitive fanin of a particular output of the template. The set of templates may also include tree templates.

In some embodiments, the set of templates is a complete set of templates given certain assumptions including that the set of templates include all maximal templates of involved classes of templates and a template is not generated through permuting gate inputs.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

1. Overview

Figure 1:
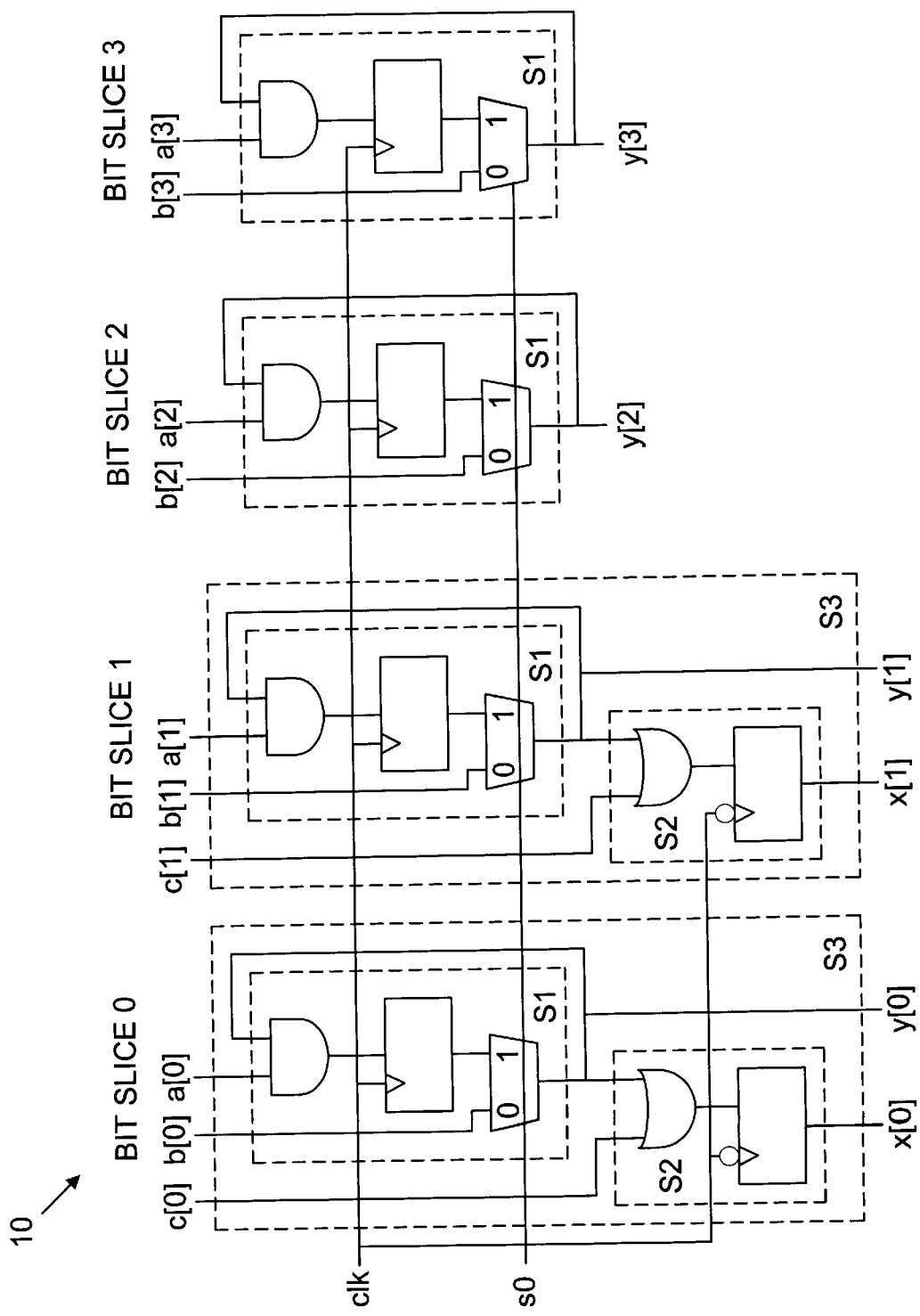
FIG. 1 is a schematic representation of a circuit and three templates that cover different portions of the circuit.

The invention includes a general approach to extract functional regularity for circuits (and in particular datapath circuits) from high level behavioral or structural descriptions, such as hardware descriptor language (HDL) descriptions. Verilog or VHDL are well know examples of HDL. Embodiments of the invention involve automatically generating a set of templates, where a template is a representation of a subcircuit with at least two instances in the circuit. In that a circuit may be represented as a graph, a subcircuit may be called a subgraph. A subgraph may be an instance of a template. In some embodiments, the set of templates is the complete set of all possible templates under some simplifying assumptions. The set of templates may include more than one class of templates. For example, in some embodiments, one class of template is a tree template and another class is a special class of multi-output templates, called single-principal output (single-PO) templates, where all outputs of the template are in the transitive fanin of a particular output of the template. A tree could be viewed as a special case of a single-PO template, having only one output. Nevertheless, a tree template is considered to be a different class than a single-PO template. In some embodiments, different algorithms are used to generate tree and single-PO templates.

As is described below, a subset of this set of templates is chosen to cover the circuit. Unlike prior art techniques, a user does not have to specify the templates to be used. In some embodiments, however, a user may designate some templates.

The phrase "some embodiments" refers to at least some embodiments of the invention. The various appearances "some embodiments" are not necessarily referring to the same embodiments. If the specification states a component, feature, structure, or characteristic "may", "might", or "could" be included, that particular component, feature, structure, or characteristic is not required to be included. Reference in the specification to "an embodiment" or "one embodiment" means that a particular feature, structure, or characteristic described in connection with the embodiment is included in at least some embodiments, but not necessarily all embodiments, of the invention.

The components of a circuit in the high level descriptions may be logic gates (such as AND, OR and multiplexers) or arithmetic operators (such as adders and shifters). The task of regularity extraction is to identify a set of templates, and cover the circuit by a subset of these templates, where the objective may be to use large templates with many instances. However, the regularity extraction often involves a tradeoff, since a large template usually has a fewer instances, while a small template may have many instances. Formulation of a good set of templates may allow tradeoffs among multiple criteria, such as area, timing and power, and allow a user to build multi-technology designs, such as using a combination of static and dynamic logic. Prior art techniques will miss many of these tradeoffs and produce suboptimal covers. There may be different templates with the same functional description where the high level language specifies a difference (e.g., the loading on a component in the templates).

The following is an example of an HDL description.

```
Inputs a[3:0], b[3:0], c[3:0], s0;
Clock clk;
Outputs x[1:0], y[3:0];
begin main
for i = 0 to 3 do
    {d[i] :=a[i] AND y[i];
     e[i] :=d[i] on rising clk;
     y[i] :=if s0 then e[i]
           else b[i]}
for i = 0 to 1 do
    {f[i] = c[i] OR y[i];
     x[i] = f[i] on falling clk;}
end main;
```

FIG. 1 illustrates a circuit 10 that could be created from the above HDL description. Circuit 10 include four bit slices (0–3). The HDL description includes two do-loops. A first template S1 includes the elements of the first do-loop. (The "S" in S1 represents "sub".) Because in the first do-loop, i goes from 0 to 3, S1 is included in each of the four bit slices (0–3). A second template S2 includes the elements in the second do-loop. Because in the second do-loop, i goes from 0 to 1, S2 is included in only bit slices 0 and 1. A third template S3 includes S1 and S3 in bit slices 0 and 1. The invention can be used to extract regularity from the HDL description by systematically generating templates S1, S2, and S3 and then covering circuit 10 with a subset of the templates. One cover includes the four instances of S1 and the two instances of S2. Another cover includes the two instances of S3 and the two instances of S1 not included in S3. In some embodiments, as part of the cover process, S2 and the two instances of S1 included in S3 would be removed from the list of possible templates in the cover. Templates S1 and S2 are examples of a tree template and template S3 is an example of a single-PO template. From a broader perspective, templates S1 and S2 are also single-PO templates.

A maximal template is the maximum size it could be and still be a template. A submaximal template is a template within another template. For example, there are four instances of an AND gate template, which is a submaximal template because it is inside template S1. In some embodiments, such submaximal templates are not generated. In other embodiments, they are generated, but are eliminated from consideration as part of the covering process. A template may be a maximal template for purposes of tree templates, but a submaximal template when considered for single-PO templates. For example, for purposes of tree templates, S2 is a maximal template. For purposes of single-PO templates, S2 is a submaximal template because it is within template S3.

Regularity in a given circuit can be either functional, structural or topological. Given a high-level (behavioral or structural) description, a functionally-regular circuit uses a set of functionally-equivalent operations or subcircuits (templates). Functional regularity can be used to restructure the HDL code, for instance to improve the quality of high-level synthesis results by identifying opportunities for resource sharing. Structure in an HDL description typically refers to declaratively specified blocks including a netlist which can be described schematically by assigning a horizontal or vertical direction to the nets. Finally, a topologically regular design having an ordered set of blocks which gives a good initial placement for the circuit. The present invention particularly concerns functional regularity, but may have application to structural and topological regularity.

2. Problem Formulation

Figure 2:
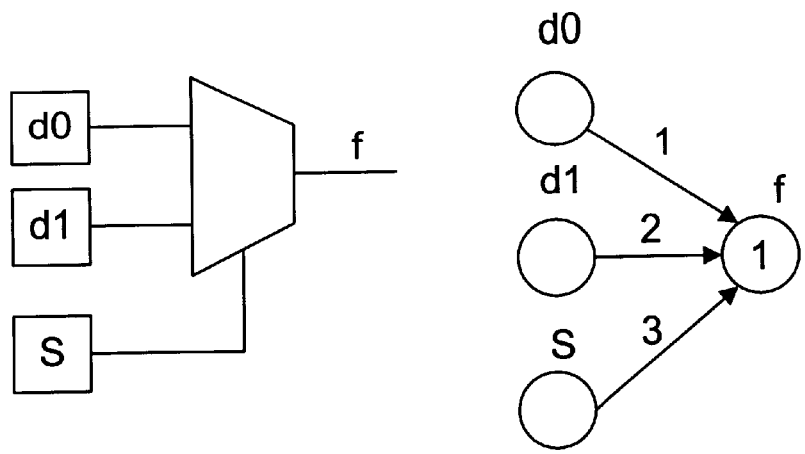
FIG. 2 is a schematic and graphical representation of a 2-to-1 multiplexer.
Figure 3:
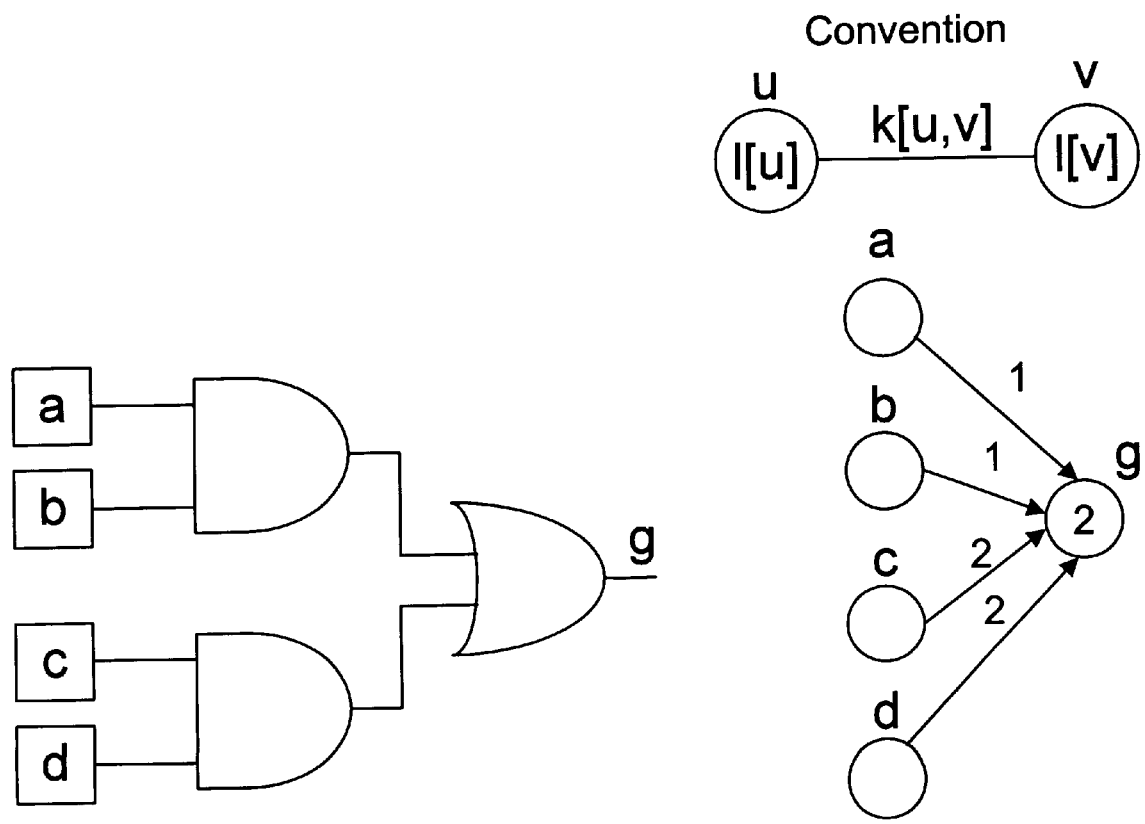
FIG. 3 is a schematic and graphical representation of an AND-OR gate.

The following provides details used in connection with some embodiments. However, the invention is not limited to the particular details. The input to regularity extraction is a circuit C composed of components that can be logic gates or arithmetic operators. C is usually described using an HDL. We may represent C by a directed graph G(V,E), where the nodes in V correspond to the logic components or the primary inputs of C, and the edges in E correspond to the interconnection among the components and primary inputs of C. The set V can be partitioned into two subsets I and L, which correspond to the sets of primary inputs and logic components, respectively. The set O of primary outputs is a subset of L. We represent the logic functions of components of C in G by a pair of functions. We first define a logic function $1:L \rightarrow \{1, \ldots, l_0\}$, where $l_0$ is the total number of distinct types of logic functions. If $1[u]=1[v]$, then u and v correspond to the same logic function, e.g. a 2-to-1 multiplexer. Similarly, we associate an index $k:E \rightarrow \{1, \ldots, k_0\}$ with every edge in e, where $k(u_1,v)=k(u_2,v)$ implies that the two incoming edges of v are equivalent. For example, FIG. 2 shows a multiplexer whose input edges have all distinct indices, while the AND-OR gate of FIG. 3 has four edges assigned to only two indices.

A subgraph of G is a graph Gi(Vi,Ei) such that Vi⊆V and Ei⊆E. Vi is partitioned into Ii and Li. The set Oi of primary outputs is again a subset of Li. A subgraph of G corresponds to a subcircuit of C. We consider only those subgraphs which satisfy the condition that if $v \in Li$, then $u \in Ii \cup Li$ for every node u connected to v by an edge (u, v) in G. We call the subgraphs which satisfy the condition feasible subgraphs of G, since they correspond to meaningful subcircuits of C. From here on, a subgraph will imply a feasible subgraph.

We consider two subgraphs Gi and Gj functionally equivalent, if and only if (a) they are isomorphic, i.e. there exists a one-to-one mapping $\phi$ between Vi and Vj, (b) the logic functions of corresponding nodes are same, i.e. $1[v]=1[\phi[v]]$, and (c) the indices of corresponding edges are also the same, i.e. $k[u,v]=k[\phi[u], \phi[v]]$. We call the equivalence class of this relation a template. Any set S of subgraphs of G can be partitioned into m templates, $S_1, \ldots, S_m$, where a template Si contains |Si| subgraphs. We estimate the area of a subcircuit that corresponds to the template Si by $area[Si]=\Sigma v \in Li\, a[1[v]]$, where a[j] is the area estimate of a node of logic function j.

A cover of G is a set $C(G)=\{G_1, \ldots, G_n\}$ of feasible subgraphs of G that satisfies the following conditions:
1. Every node of G belongs to at least one subgraph in C(G), i.e. $V \subseteq V1 \cup \ldots \cup Vn$.
2. If a node v is a primary input of a subgraph, then it is either a primary input of G or an output of another subgraph, i.e. for all $v \in Ii$, $v \in I \cup O1 \cup \ldots \cup On$.

In some embodiments, a problem of regularity extraction is stated as follows. Given a circuit represented by a graph G, find a cover $C(G)=\{G_1, \ldots, G_n\}$, which is partitioned into m templates $S_1, \ldots, S_m$, such that the number of n of subgraphs and the overall area $\Sigma_{i=1}^{m} area[Si]$ of the templates are maximized. Maximizing the number of subgraphs will reduce the effort needed to design the circuit, while maximizing the area of templates will reduce the overall area and delay by facilitating better optimization during technology mapping and layout. The above two objectives are conflicting, since a large template usually has only a few subgraphs.

In general, finding an optimal cover is NP-complete (not polynomial time solvable), even when the subgraphs are selected from a given set. Here, the problem is even more complex, since there is no such set of subgraphs for selecting the cover. In some embodiments, the problem complexity is reduced by decomposing it into two parts, where a set of templates is first generated, followed by selecting a subset of the template set to cover G. Two sub-problems are stated below.

In some embodiments, with respect to graph covering, given a circuit represented by a graph G, the complete set of tree and/or single-PO templates is generated given certain assumptions.

In some embodiments, with respect to graph covering, given a circuit represented by a graph G and its set $S_T(G)=\{S_1, \ldots, S_p\}$ of templates, find a cover $C(G, S_T)=\{G_1, \ldots, G_n\}$ of G, which is partitioned into $m (\leq p)$ templates, such that the number n of subgraphs and the overall area $\Sigma_{i=1}^{m} area[Si]$ of the templates are maximized.

3. Complexity of Template Generation

The following are some practical assumptions used in some embodiments, which will reduce the number of templates addressed to within $V^2$ (i.e., V*V). These assumptions will be justified in the context of regularity extraction.

Assumption 1. The set of templates includes all maximal templates of a given class. (The definition of templates assumes there must be at least two instances.) In some embodiments, the set may also include submaximal templates, which may be removed in the covering process.

Figure 4C:
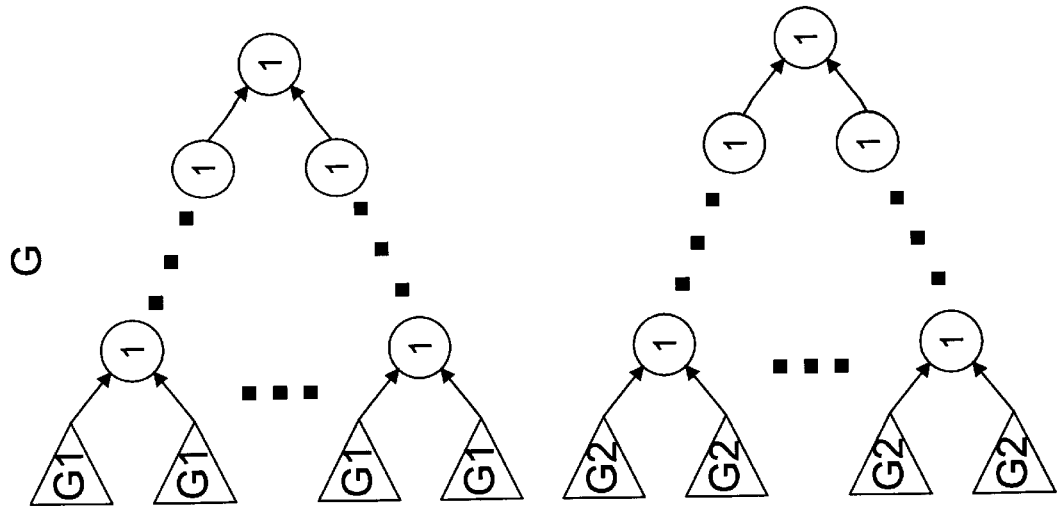
FIG. 4C illustrates a graph G with the number of templates given by $O(2^V)$.
Figure 4B:
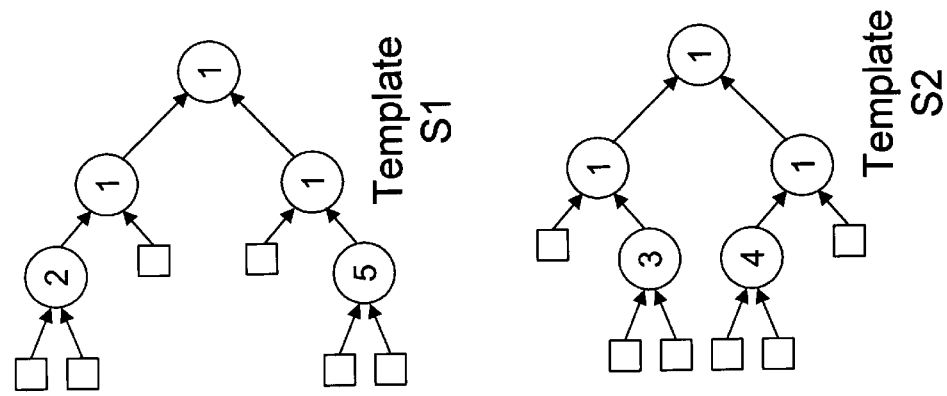
FIG. 4B illustrates two templates obtained by permuting the incoming edges of the nodes of FIG. 4A.

The number of templates can be $O(2^V)$ (i.e., on the order of $2^V$) even after considering Assumption 1. Consider the graph G' of FIG. 4A composed of two unconnected trees, where the incoming edges of every node have the same index. It has two templates shown in FIG. 4B. The graph G of FIG. 4C is composed of two unconnected binary trees such that all the internal nodes have the same function $1[v]=1$, while the leaf level is composed of one of the two subgraphs, G1 or G2. The number of templates of G is $O(2^V)$, since every pair of subgraphs G1 and G2 can be matched using either of the templates of FIG. 4B.

In some embodiments, we make the following assumption that does not allow permuting the incoming edges of a node even though the two edges (u1,v) and (u2,v) have the same index $k[u_1,v]=k[u_2,v]$. For example, the two input edges of a node corresponding to an OR gate would be assigned different indices, even though they are equivalent.

Assumption 2. A template is not generated through permuting gate inputs. From another perspective, for every node v of G with incoming edges from nodes $u_1, \ldots, u_f$, every edge is assigned a unique index of $k[u_i,v]=i$, for all $1 \leq i \leq f$. In some embodiments, templates are not generated from permuted inputs. In other embodiments, the templates are generated from permuted inputs, but are eliminated in the covering process.

Figure 4A:
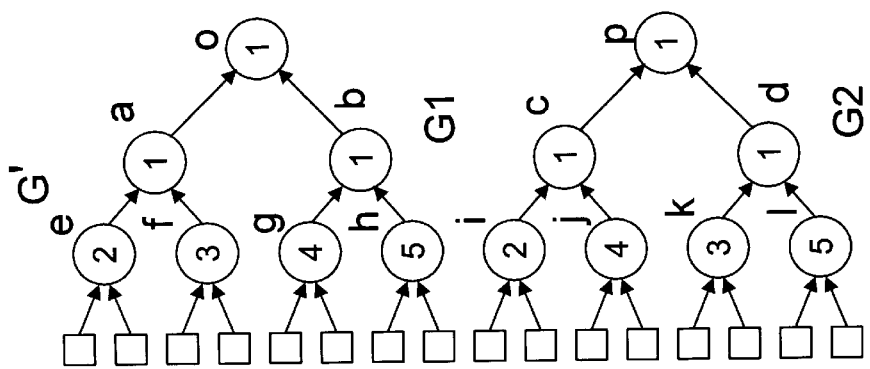
FIG. 4A is a graph G'.
Figure 5:
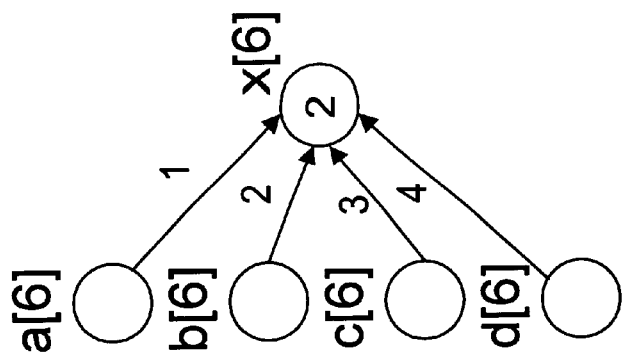
FIG. 5 illustrates representations for an HDL assignment.
Figure 5:
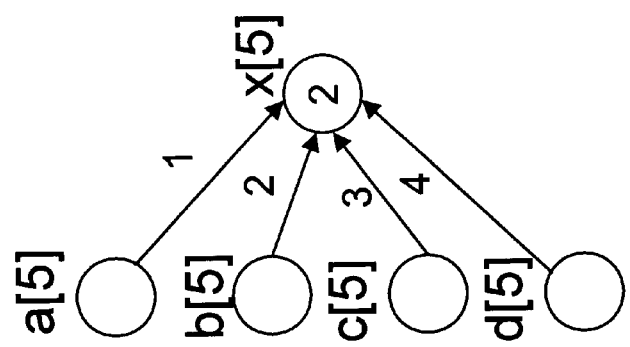
Figure 5:
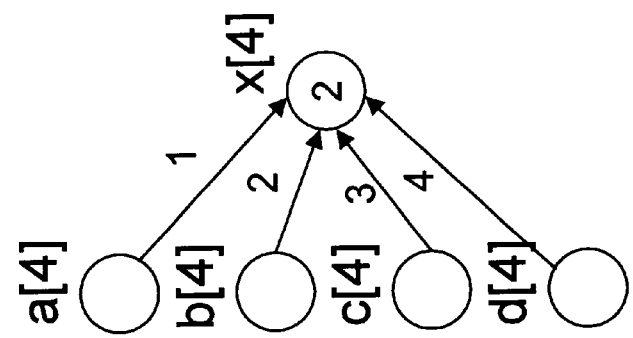
Figure 5:
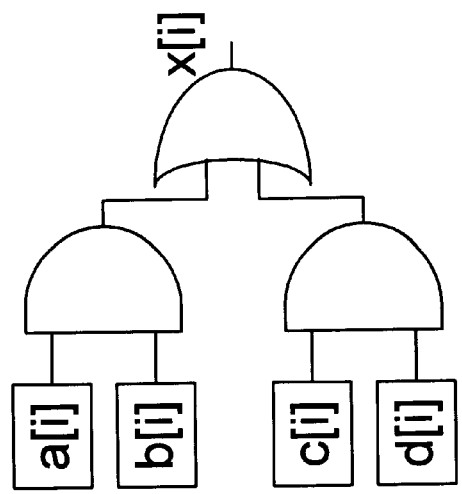

Assumption 2 disallows S2 (shown in FIG. 4B) as a template for the graph of FIG. 4A because S2 would be created by permuting nodes f and g and nodes j and k. As a result, the graph G' of FIG. 4C also has a single template. The justification for the above assumption is that G is constructed from an HDL description of C, which ensures that nodes with the same function are defined identically. For example, as illustrated in FIG. 5, the HDL assignment statement "for i=4 to 6 $\{x[i]=a[i]b[i]+c[i]d[i]\}$" will correspond to three nodes which are transformed identically in building G. The above assumption does not rule out the regularity inherent in the HDL description. The edge indices are different from those in FIG. 3 as a result of Assumption 2. Different embodiments of the invention may follow Assumption 1 and/or Assumption 2 and/or other assumptions.

Details regarding generation of tree templates and single-PO templates in some embodiments are now considered.

4. Generation of Tree Templates

A tree template is a template having a single output and no internal reconvergence. An example of internal reconvergence is a path that separates to parallel paths (where one or both of the parallel paths may have an intermediate node) and reconverges to a node. We present an algorithm (e.g., Pseudocode Sample 1) for generating all tree templates of a given graph G. Pseudocode Sample 1 assures Assumption 2 but may generate sub-maximal templates in violation of Assumption 1. However, the sub-maximal templates can be removed prior to completion of covering. It can be shown that the number of tree templates is reduced to within $V^2$ under assumptions 1 and 2, which makes the enumeration of such templates practical. We will analyze the complexity for the case where the fanin of the nodes in G is bounded. The templates are stored in a set $S_T=\{S_1, \ldots, S_m\}$ where every template Si is a class of functionally-equivalent subgraphs. In some embodiments, instead of storing each template completely, we store a template as a set of hierarchically organized templates. A template Si can be completely defined by the logic function of its root node, denoted by root_fn[i], and the list of templates children_templates[i]= $\{S_1, \ldots, S_f\}$ to which the subgraphs rooted at the f fanin nodes of the root node belong.

Figure 6:
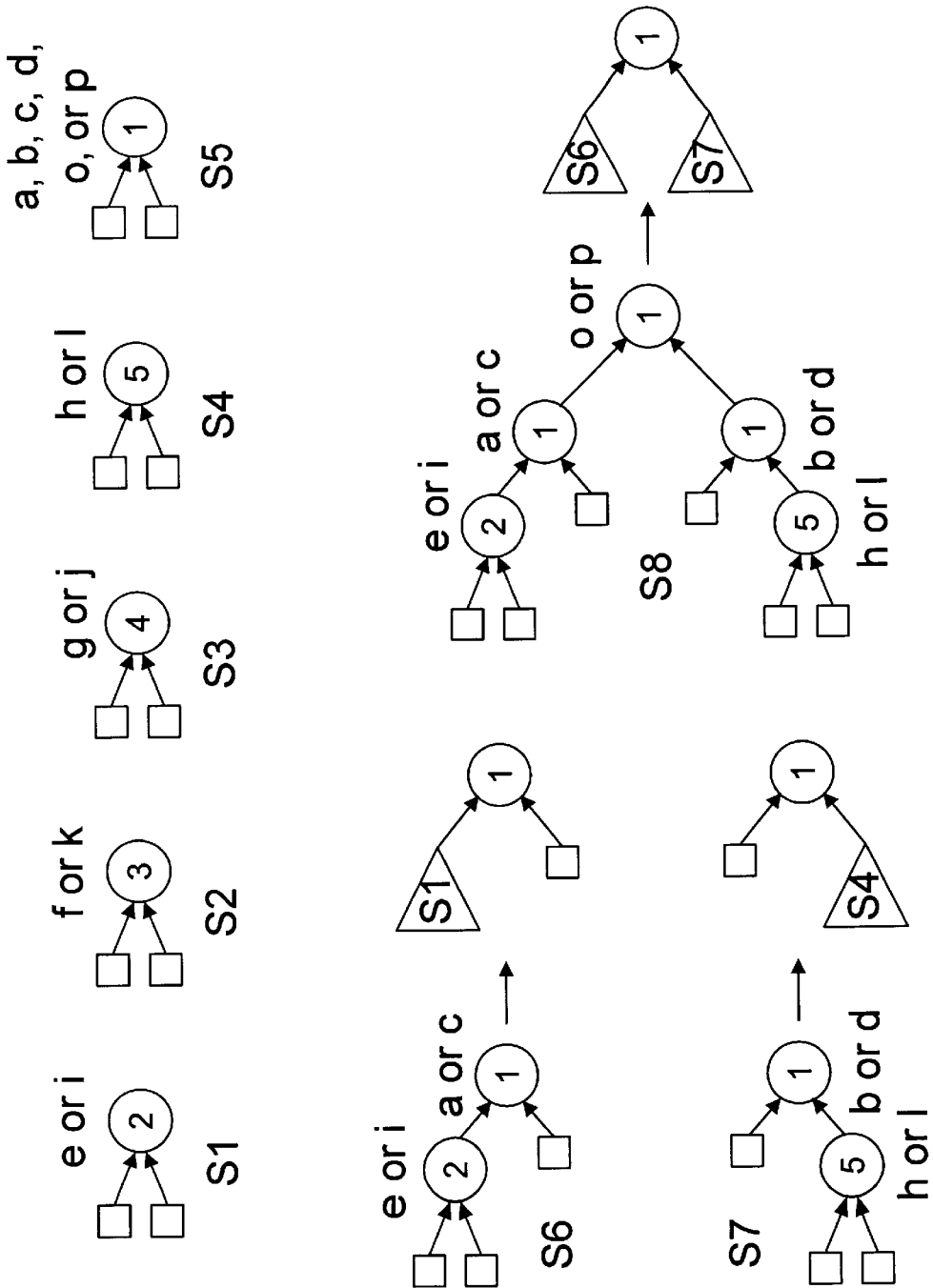
FIG. 6 illustrates tree templates for the graph of FIG. 5.

For example, FIG. 6 illustrates templates $S_1, \ldots, S_8$ of the graph G' (in FIG. 4A). The template S8 can be precisely defined by root_fn[8]=1 and children_templates[8]={S6, S7}. We also reduce the space required for storing the subgraphs of each template by simply storing the root node of the subgraphs in the list root_nodes[i]. In case of the template S8 in FIG. 6, root_nodes[8]={o,p}. It can be shown that the subgraphs of a template Si can be precisely reconstructed using root_fn[i], and the lists children_templates [i] and root_nodes[i].

For efficiency reasons, the template list ST may be sorted by a composite key of size f+1, defined as key={root_fn, children_templates}, where f is the number of fan-in nodes. A tree template generation algorithm as used in some embodiments of the invention is presented in Pseudocode Sample 1, below:

/* A tree template Si is completely defined by (i) root_fn[i] (logic function of the root node); (ii) children_templates[i] (a list of children templates that form Si); (iii) root_nodes [n] (a list of the root nodes of subgraphs of Si (all the subgraphs of Si can be constructed form these three fields)) */

Pseudocode Sample 1. Pseudocode Sample 1 generates a complete set of tree templates meeting Assumption 2. Some embodiments could use an algorithm that generates a smaller set of tree templates than does Pseudocode Sample 1. Further, an algorithm could generate a complete or partial list of single output templates that may include reconvergence, although the complexity may be significantly greater than with Pseudocode Sample 1.

An example of the operation of Pseudocode Sample 1 can be given with reference to FIG. 6. First, the nodes of G are topologically sorted (line 03). Topologically sorting means sorting from primary inputs to outputs (or left to right). A number level is assigned to each node. For example, in FIG. 4A, a first level includes nodes e, f, g, h, i, j, k, and l; a second level include nodes a, b, c, and d; and a third level includes nodes o and p. In line 06, the template has two indices, where each index represents each node. The loops of lines 07 and 08, cause each node pair to be considered. For every pair of nodes, the function Largest_Template generates a template with two subgraphs, one rooted at each

```
01   Generate_Templates(G(V,E))
02   begin
03   topologically sort the nodes of G as {v1, . . . , VN};
04   ST := ∅; /* ST stores the list of templates */
05   m := 0; /* m is number of templates generated so far */
06   templates [v1 . . . VN, v1 . . . VN] := 0;
     /* template [vi, vj], if non-zero, gives the index of template to which functionally-equivalent
     subgraphs rooted at nodes vi and vj belong */
07   for i = 1 to N
08      for j = i + 1 to N
09         m := m + 1; /*new template to be stored in Sm */
10         Sm := Largest_Template(vi, vj);
           /* generates a template with two largest functionally-equivalent subgraphs
           Gi and Gj rooted at vi and vj, respectively */
11         if Sm ≠ ∅
12            k := Find_Equivalent_Template(Sm, ST); /* find Sk in ST equivalent to Sm */
13            template[vi, vj] := k;
14            if k = m /* Sm is a new template */
15               ST := ST ∪ {Sm}; /* add Sm to ST, such that it remains sorted */
16            else
17               root_nodes[k] := root_nodes[k] ∪ {vi, vj};
18               m:= m − 1;
19   return ST;
20   end
     /* generates largest trees rooted at u and v that are functionally equivalent */
21   Largest_Template (u, v)
22   if 1[u] ≠ 1[v] /* u and v have different logic functions */
23      return ∅;
24   else
25      root_fn[m] := 1[u]; /* setting fields of template Sm */
26      for i = 1 to f do
           /* both u and v each have f fanin nodes, {u1, . . . , uf} and {v1, . . . , vf} */
27         if ui and vi have a single fanout each
28            add template [ui, vi] to children_templates [m];
29            else add ∅ to children_templates[m];
30         root_nodes[m] := {u, v}; /* Sm has two subgraphs, Gu and Gv */
31      return Sm;
         /* ST is a list {Si, . . . , Sj} of templates sorted by key = (root_fn children_templates).
         This function finds the template in ST, equivalent to Sm, by performing a binary
         search on ST = {Si, . . . , Sj} */
32      Find_Equivalent_Template (Sm, ST)
33      if ST = ∅
34         return m
35      if key[m] < key [(i + j)/2] /* check first half of ST */
36         return Find_Equivalent_Template (Sm, {Si, . . . , S((i + j)/2 + 1)});
37      else if key[m] > key [(i + j)/2] /* check second half of ST */
38         return Find_Equivalent_Template(Sm, {S((i + j)/2 + 1), . . . , Sj});
39      return (i + j)/2; /* S(i + j)/2 and Sm are equivalent */
```

Pseudocode Sample 1

It should be emphasized the invention may be implemented with different details than those recited in node. Largest_Template compares the logic function of the two nodes, and then constructs the list of children templates. The template Sm, thus generated, is compared with previously-generated templates by a binary search on $S_T$ using key. If $S_m$ is equivalent to an existing template $S_k$, then its subgraphs are added to $S_k$; otherwise $S_m$ is stored in $S_T$ as a new template. Referring to FIGS. 4A and 6, first the trivial templates $S_1, \ldots, S_4$ are generated. Then, from the remaining nodes {a, b, c, d, o, p}, $S_5$ is generated by comparing a and b, and $S_6$ is generated by comparing a and c. The template obtained by comparing a and d is found to be equivalent to $S_5$, so d is stored in the root_nodes of $S_5$. The remaining two templates $S_7$ and $S_8$, are generated by comparing the node pairs, (b,d) and (o,p), respectively. Largest_Template returns a NULL template, in the case of remaining node pairs. Note that every template has only two subgraphs, except $S_5$ with six subgraphs given by root_nodes={a,b,c,d,o,p}.

Largest_Template works recursively and starts from the leafs (inputs) and works toward the rootnode (output) of the tree template, so that a larger template is constructed from smaller templates. Referring to FIGS. 4A and 6, the rootnode of the template $S_8$ is node o or p, which is the right most node of $S_8$ in FIG. 6. The rootnode of $S_6$ is node a or c. The rootnode of $S_7$ is node b or d. Templates $S_6$ and $S_7$ are constructed before template $S_8$. The rootnode of $S_6$ and $S_7$ are children with respect to $S_8$. The intermediate rootnode of templates $S_6$ and $S_7$ they are joined to node a or c and node b or d (see FIGS. 4A and 6) to form template $S_8$.

Lines 26–28 assure that Assumption 2 is met by disallowing input permutations.

In some embodiments, Largest_Template takes a constant time for bounded-fanin graphs. Binary search on $S_T$ (lines 32–39) as well as insertion of $S_m$ in $S_T$ (line 15) take $O(\log V)$ time, both of which are called for every node-pair. Thus, the overall time complexity is $O(V^2 \log V)$. We store root_fn and children_templates for every template, which requires a memory of $O(V^2)$. The storage required for subgraphs is also $O(V^2)$, since a subgraph is stored just as its root node. Thus, the overall storage complexity is $O(V^2)$.

The Find_Equivalent_Template function (lines 32–29) is used to find a short hand way to identify a template. For example, if a template is created, it may contain a fairly large amount of information to specify its nodes. Another instance of the template can be expressed with much less information by merely observing that it is the same as the first template.

5. Multi-output Templates

The template generation algorithm Pseudocode Sample 1 gives excellent covers for datapath circuits composed of sparsely interconnected subcircuits, but it might not perform well for circuits with a high number of multiple-fanout nodes. More specifically, in addition to generating tree templates, some embodiments of the invention can generate a special class of multi-output templates referred to herein as a single principal-output (PO) subgraph (template). A single-PO subgraph is a multi-output subgraph, whose every output lies in the transitive fanin of a particular output. For example, in FIG. 1, template $S_3$ is an example of a single-PO template because it is a multi-output template (it has outputs x and y), but output y is in the transitive fanin of output x.

Single-PO graphs have several interesting properties. They can have internal reconvergence as well as cycles, and can have any number of outputs, in contrast to trees. A main advantage of using single-PO subgraphs is that despite their complex structure, the number of such subgraphs of G under the Assumptions 1 and 2 is also restricted to $V^2$, provided the subgraphs satisfy the convex property that if u, v∈V (Gi), then every node w on a path from u to v also belongs to V(Gi).

Figure 7:
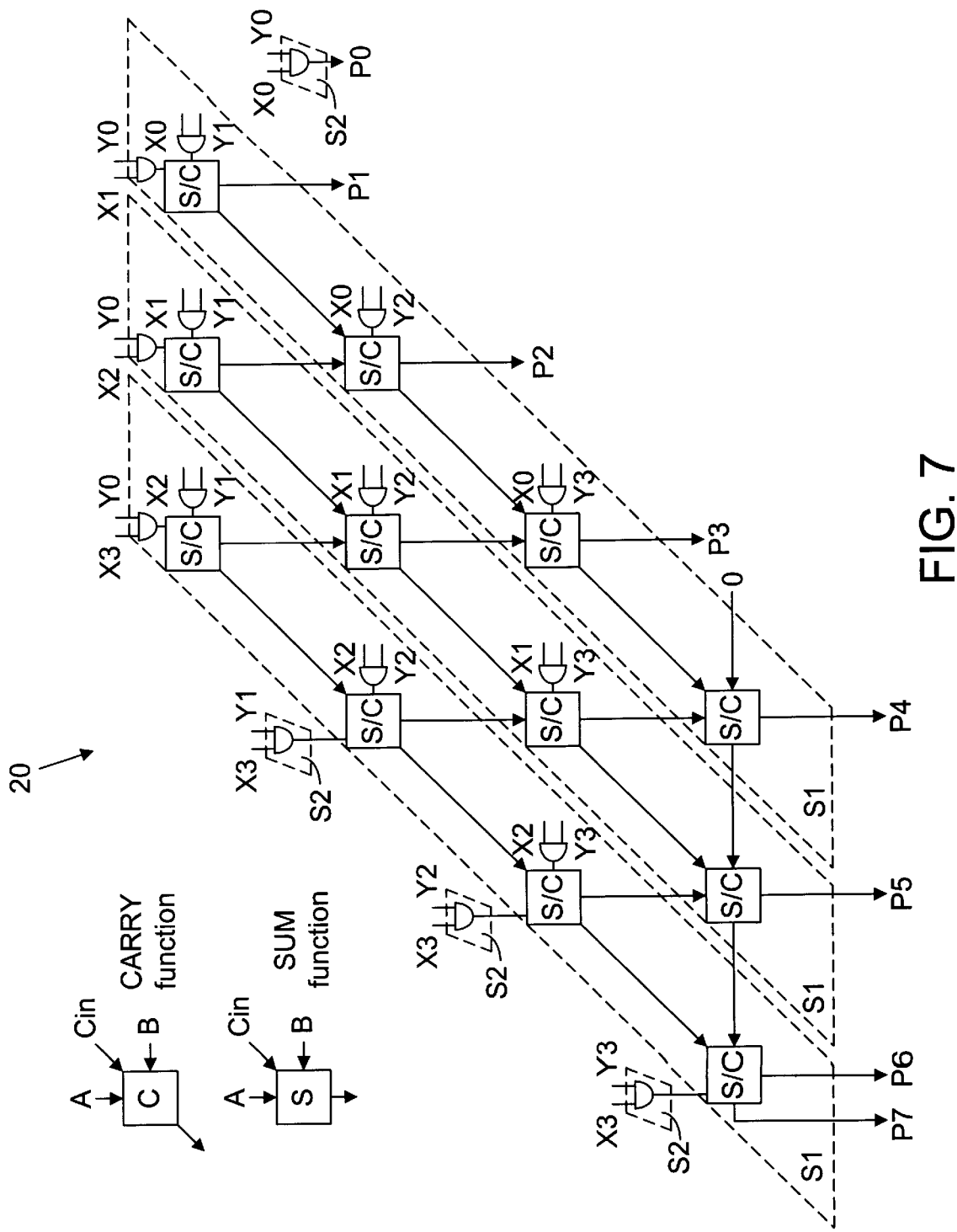
FIG. 7 is a schematic representation of a multiplier circuit which is covered by different instances of two templates.
Figure 8:
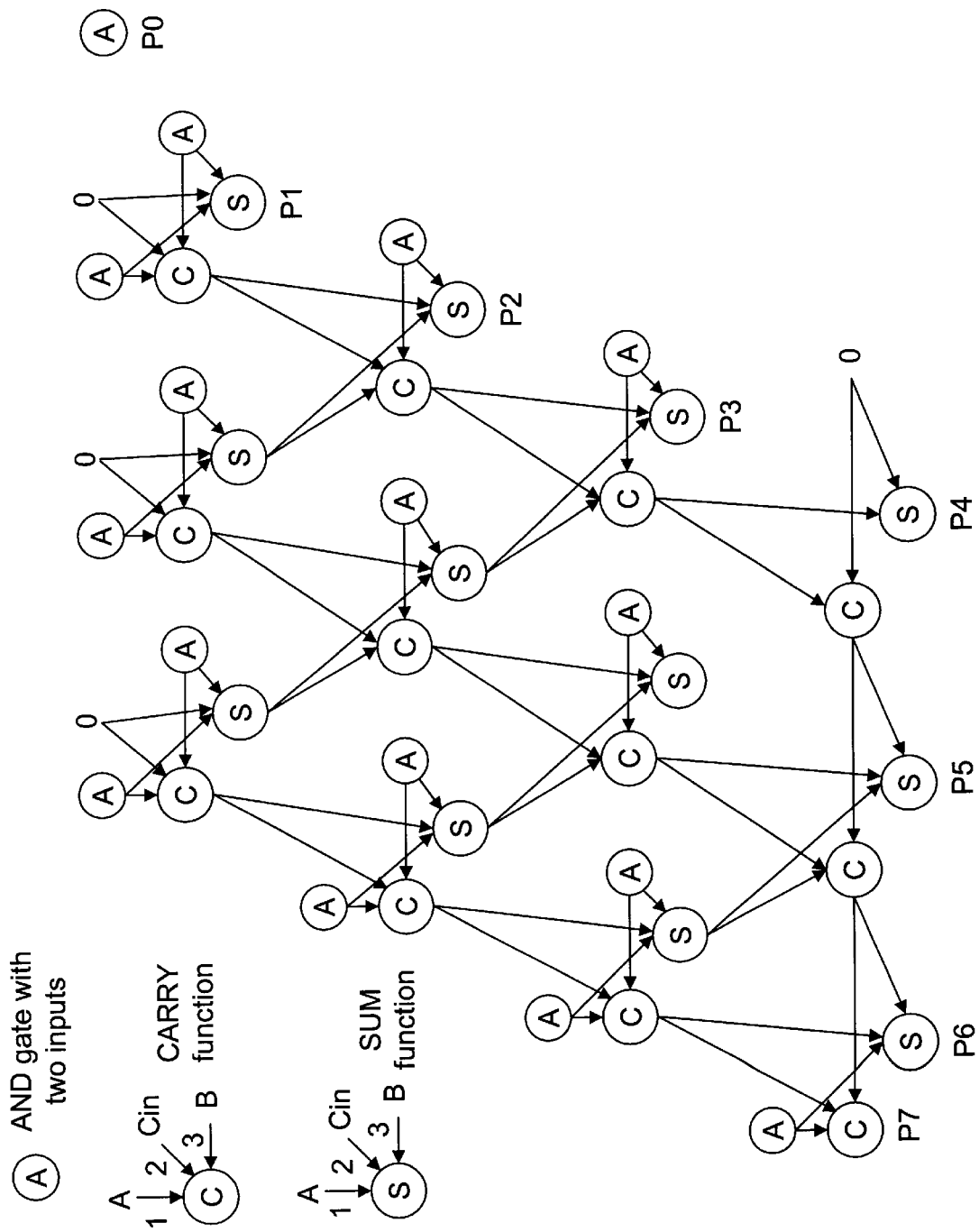
FIG. 8 illustrates a graph corresponding to the multiplier of FIG. 7.
Figure 9A:
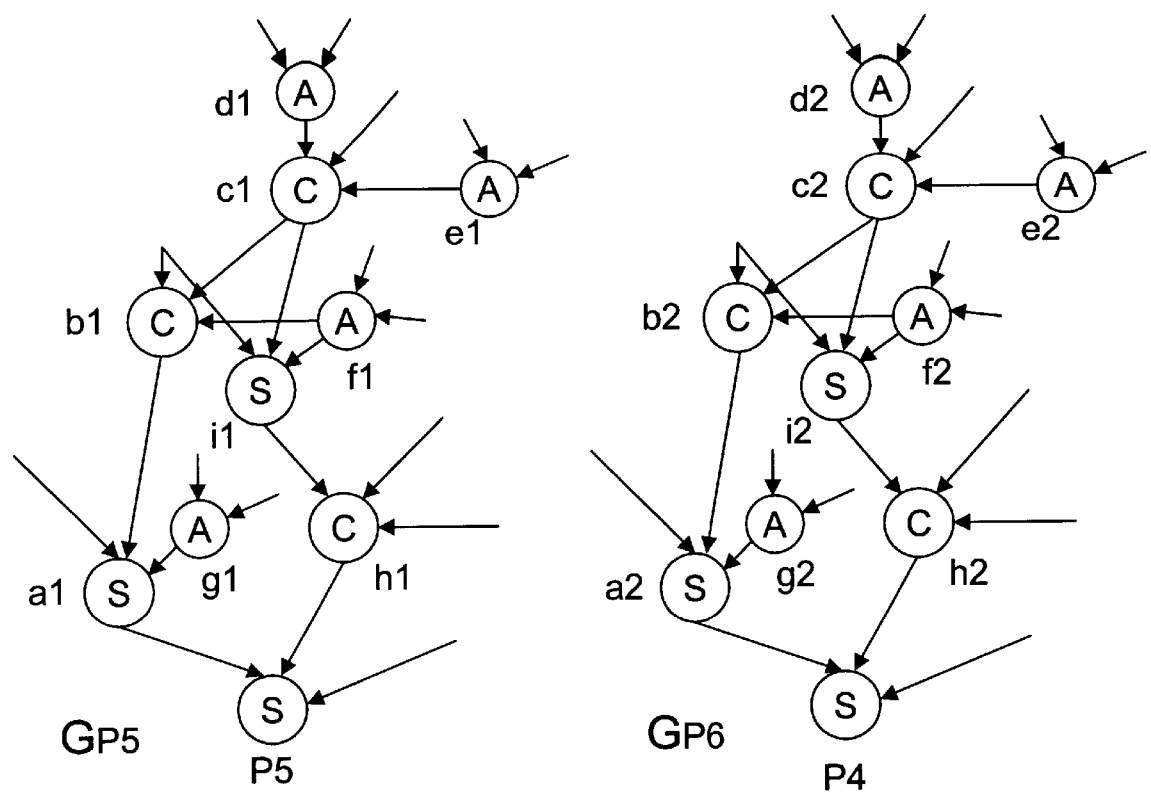
FIG. 9A illustrates two functionally-equivalent subgraphs of the graph of FIG. 8.

As another example, FIG. 2 illustrates a 4×4 multiplier 20, in which a template $S_1$ includes diagonal arrays and a templates $S_2$ includes AND gates. C/S represents the CARRY and SUM functions. Multiplier 20 is covered by 3 instances of template $S_1$ and 4 instances of template $S_2$. Template $S_1$ is not a tree template. Accordingly, if we apply the algorithm of Pseudocode Sample 1 to the multiplier of FIG. 7, then numerous instances of three trivial tree templates: AND gate, CARRY and SUM functions, are obtained. Template $S_1$ is also not a single-PO template. Nevertheless, as illustrated and described below, the three diagonal arrays of FIG. 7 include single-PO templates. FIG. 8 is a graph version of multiplier 20 of FIG. 7. The two subgraphs shown in FIG. 9A are two functionally-equivalent single-PO subgraphs $G_{P5}$ and $G_{P6}$, with P5 and P4 (see FIG. 8) as the respective principal outputs. A single-PO template has instances of single-PO subgraphs.

Figure 9B:
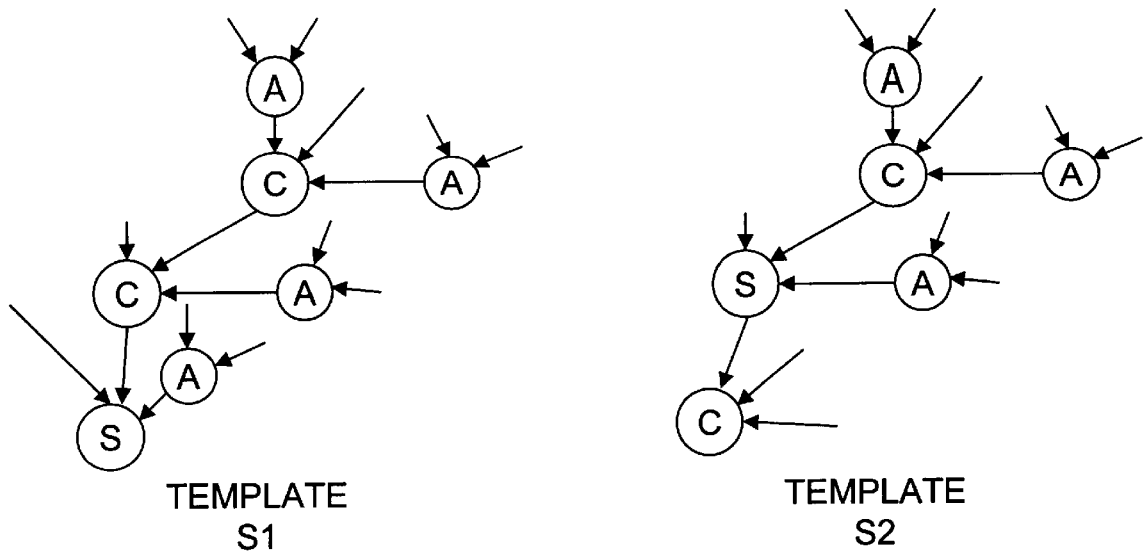
FIG. 9B illustrates two templates with overlapping nodes.
Figure 9C:
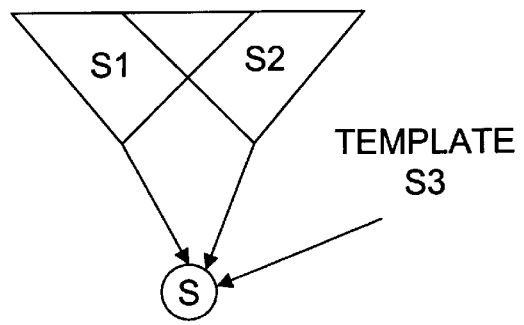
FIG. 9C illustrates a template formed from merging the two templates of FIG. 9B.

As described above, a tree template may be represented by a list of children templates which are non-overlapping. However, the children templates can overlap in single-PO templates. FIG. 9B illustrates templates $S_1$ and $S_2$ of the graph of FIG. 9A. FIG. 9C shows the template $S_3$ with two subgraphs of FIGS. 9A and 9B. $S_3$ has two children templates, $S_1$ and $S_2$, which have overlapping nodes, such as c1 of subgraph $G_{P5}$ and c2 of $G_{P4}$. Therefore, $S_3$ cannot be completely specified just by the list of its children templates. Instead, every template is specified individually. The nodes of a subgraph $G_u$ can be stored by a list nodelist using the depth-first search order. A depth-first order may be unique for all isomorphic subgraphs. The subgraph of template $S_1$ rooted at node a1 has nodelist={a1, b1, c1, d1, e1, f1, g1}. With every node in nodelist, we store its fanin and fanout links as well. Thus, in some embodiments, memory required to store a subgraph is $O(V)$ for bounded-fanin graphs.

Pseudocode Sample 2, below, may be used to generate a complete set of single-PO templates.

---

```
Repeat lines 01–20 of pseudocode Sample 1
         /*generates the largest equivalent single-PO subgraphs (templates) rooted at u and v */
01       Largest_Template(u, v)
02       if 1[u] ≠ 1[v]
03           return ∅;
04       else
05           nodelist[Gu] := {u}; /* root node is the first node in nodelist*/
06           nodelist[Gv] := {v};
07           for i = 1 to f do    /* u and v each have f fanin nodes {u1, . . . , uf} and
                                    ({v1, . . . , vf}) */
08               add nodelist [Gui] at the end of nodelist [Gu];
09               add nodelist [Gvi] at the end of nodelist [Gv];
10               for w1 ∈ nodelist [Gui and w2 ∈ nodelist [Gvi];
         /* there is a path from w1 (w2) to u (v) through the incoming edge of u (v) with index i */
```

-continued

```
11          add i to path[w1, u];
12          add i to path[w2, v];
13       for w1 ∈ nodelist [Gu] and w2 ∈ nodelist[Gv]
14          if path [w1, u] ≠ path[w2, v]
15             delete all copies of w1 (w2) from nodelist [Gu] (nodelist [Gv]);
16          else if path [w1, u] has more than one element /*here, path [w1, u] = path[w2, v] */
17             delete remaining copies of w1(w2) from nodelist [Gu] (nodelist [Gv]);
18       Sm := {Gu, Gv};
19       return Sm;
         /* ST is a list of k templates S1, . . . , Sk. This function finds the
         template ST, equivalent to Sm, if any; otherwise returns m */
20    Find_Equivalent_Template(Sm, ST)
21       for i = 1 to k
22          if nodelist [Si] = nodelist [Sm]
23             return i;
24       return m;
```

Pseudocode Sample 2

It should be emphasized the invention may be implemented with different details than those recited in pseudocode Sample 2. A complete set of single-PO templates includes at least all those single-PO templates in the circuit that meeting Assumptions 1 and 2, above. It may also include additional single-PO templates, some or all of which may be removed from the list of templates later, for example, as part of or prior to covering the circuit.

As can be observed, pseudocode Sample 2 is the same as Pseudocode Sample 1 except that the function Largest_Template (u, v) (called from line 10) and the function Find_Equivalent_Template (Sm, ST) (called from line 12) are different. As described above, a reason for the difference is that with single-PO templates, children templates can overlap (e.g., see FIG. 9C).

An example of the operation of Pseudocode Sample 2 is provided in connection with FIGS. 9A, 9B, and 9C. Prior to the call Largest_Template (P5, P4), the template S1 is already generated with two subgraphs, Ga1 and Ga2. Similarly, S2 is also generated with subgraphs Gh1 and Gh2. The nodelists of Ga1 and Gh1 (Ga2 and Gh2) are combined to obtain the nodelist of GP5 (GP4). After lines 07–09, nodelist [GP5]={P5, a1, b1, c1, d1, e1, f1, g1, h1, i1, c1, d1, e1, f1} and nodelist[GP4]={P4, a2, b2, c2, d2, e2, f2, g2, h2, i2, c2, d2, e2, f2}.

There can be multiple paths from a node w to the root node v through different incoming edges of v. As a result, w occurs multiple times in nodelist [Gv]. For example, c1 is connected to P5 through the edges (a1, P5) and (h1, P5) in FIG. 9A, and hence, it occurs twice in nodelist [GP5]. We define a list path[w, v] (lines 10–12) which contains the indices of the incoming edges of v through which w is connected to v, e.g. path[b1, P5]={1}, while path[c1, P5]= {1,2}. We then pairwise compare the nodes in nodelist of Gu and Gv (line 13). If the path lists of the corresponding nodes are different, then these nodes have to be removed from the respective subgraphs (lines 14–15). Otherwise, if the two path lists are same, but have multiple indices, then the remaining copies of these nodes have to be removed. For example, the second occurrence of the node c1 (c2) in GP5 (GP4) is deleted. Finally, after line 21, nodelist[GP5]={P5, a1, b1, c1, d1, e1, g1, h1, i1} and nodelist [GP4]={P5, a1, b1, c1, d1, e1, g1, h1, i1}, and nodelist [GP4]={P4, a2, b2, c2, d2, e2, g2, h2, i2}. The function Find_Equivalent_Template compares a template with every other template in the set ST by matching corresponding nodes in the two nodelist's, since the depth-first order of the nodes of a graph is unique.

In some embodiments, Largest_Template takes O(V) time, since it constructs two nodelist's and then traverses them twice. Find_Equivalent_Template takes $O(V^3)$ time, since it compares two nodelist's at most $V^2$ times. These two functions are called for every node-pair (line 07–08, Pseudocode Sample 1), resulting in the time complexity of $O(V^5)$. The nodelist of every subgraph requires a storage of $O(V)$, resulting in a storage complexity of $O(V^3)$. If the number of single-PO templates of G is bounded by S, then the overall time and space complexity may be given by $O(S^2V)$ and $O(S\ V)$, respectively.

If designer provides a template GT, we can generate all its complete as well as partial matches in the input graph G by calling the function Largest_Template (line 10, Pseudocode Sample 1) for every node-pair (vi, vj) where vi and vj belong to G and GT, respectively. This feature allows the designer to control the extraction approach and improve the circuit cover as desired.

6. Covering of Graph by Templates

The above described algorithms generate a set of ST templates for G. ST can be either a set of all tree templates or a set of all single-PO templates of G under the Assumptions 1 and 2. The set of all templates generated includes the sum of the sets of templates of the different classes of templates (e.g, ST=ST(TreeTemplates)+ST(Single-POTemplates).)

In many circuits, all components and associated paths of the circuit can be included in at least one template. However, other circuits may include one or more components that cannot be in a template because they appear only once. Accordingly, the phrase "covering the circuit" means to cover those components of the circuit that are included in an instance of a generated template. In some embodiments, in some cases, a component may initially be part of an instance of a template, but can be left out of a template during the covering process. In many circuits, there will be many possible covers (combinations of instances of templates that include the entire circuit). In that case, the "subset of the templates" will be fewer than all generated templates. However, where the only possible cover involves using instances of all generated templates, the phrase "subset of the templates" includes all the generated templates.

If sub-maximal templates are generated, Assumption 1 (only maximal templates) is met during the covering process.

Let S denote the set of all subgraphs in the templates stored in ST. Now, we present a solution to the graph covering problem, where given G and ST, the objective is to find a subset C(G, ST) of the set S of all subgraphs that forms a cover of G.

In some embodiments, heuristics are used to select the cover. In some embodiments, the following process is used. First, a template Si with a maximum objective function out of all templates in S$_T$ is selected. (A template with the maximum objective function is the one that most meets the heuristic or is the tie breaking template in the case of a tie.) Next, all nodes that belong to the non-overlapping subgraphs of S$_i$ are deleted and other templates of S$_T$ are removed from a list of templates. Then, a new set S$_T$ of templates for the remaining graph (uncovered circuit) is generated, which regeneration may result in different templates than existed before the templates of S$_T$ other than S$_i$ were removed from the list. A new template S$_i$ with a maximum objection function is selected. This process is repeated until either all nodes of G are covered, or S$_T$ is found to be NULL. If some nodes are left uncovered and S$_T$ becomes NULL, then the remaining nodes may be stored in a template with a single subgraph. (In case of datapath circuits, this template correlates to its control logic.)

Note that in the process of regenerated templates S$_T$ for the remaining graph, there may be nodes that are not contained in a template because there is no repetition, although they were initially in an instance of a template. Non-overlapping subgraphs of S$_i$ are ones in which there is not a node (component) shared by the two. Overlapping subgraphs of S$_i$ are ones in which there is a node (component) shared. For example, in FIG. 1, if the AND gate of S1 of bit slice 1 were deleted, but the output of the AND gate of S1 of bit slice 0 were fed into the input of the latch of S1 of bit slice 1, then, in some embodiments, they would be overlapping subgraphs of S1. In the covering process, the latch and MUX of bit slice 1 may not be included in a template after regeneration of templates.

In other embodiments, first, template S$_i$ is selected. Next, all nodes inside template S$_i$ are deleted, but other templates in S$_T$ are retained as is. Then, another template S$_i$ is selected from the remaining templates in S$_T$, rather than regenerating a new set of S$_T$ for the uncovered portion of the circuit. It is possible that a better cover will be obtained by regenerating the set of templates, but it also takes more time.

The following are two covering heuristics based on an objective function that may be used for selecting templates.

1. Largest-Fit-First (LFF) heuristic: Select the template S$_i$ with the maximum area area[S$_i$].
2. Most-frequent-Fit-First (MFF) heuristic: Select S$_i$ with the maximum number |S$_i$| of subgraphs (instances). In some embodiments, heuristic 2 is further modified as follows. Where two templates have an equal number of instances, and one template is larger than another, the larger template is selected as S$_i$. Heuristic 2 might also be modified such that a submaximal template must have at least two nodes to be selected where an instance of the submaximal template is included in a template with more than one node.

Usually, the MFF and LFF heuristics give different covers, since a template with a large area has few subgraphs, and vice-versa. Heuristics other than LFF and MFF (e.g., combination of the LFF and MFF) could be used, and there may be additional modifications (e.g., as mentioned with respect to the MFF).

Consider examples with respect to FIG. 1. If the LFF heuristic is chosen, template S3 is selected as S$_i$. Templates S2 and the two instances of templates S1 in the instances of template S3 are removed from consideration. In some embodiments, the other two instances of template S1 (bits slices 2 and 3) would be deleted, but templates for the remaining portion of the circuit (i.e., bit slices 2 and 3) would be regenerated. In other embodiments, templates in the remaining portion of the circuit (i.e., the circuit other than in instances of S3) are not deleted and not regenerated. Whether retained or regenerated, the two instances of S1 would then be selected to cover the remaining portion of the circuit. The result would be the circuit is covered by instances of S3 for bit slices 0 and 1 and instances of S1 for bits slices 2 and 3.

If the MFF heuristic is chosen, template S1 would be selected as S$_i$. There are also four instances of AND, latch, and MUX components but (1) S1 is larger and (2) the AND, latch, and MUX templates have only one node (component) each. If the two latches in S2 were the same as the latch in S1, there would be six instances of the latch. However, in some embodiments, that latch would not be selected, because such a template would have only one node and S1 would have more than one node (note modification to Assumption 1). (One disadvantage of allowing single node templates is it could break up other larger templates that would be more useful.) Once template S1 are selected, all sub-maximal templates in S1 are removed from consideration. Then, depending on the embodiment, template S2 is either removed and regenerated, or simply retained. The final cover would be four instances of template S1 and two of template S2.

The cover of the 4×4 multiplier of FIG. 8 obtained using the LFF heuristic contains six templates, where the largest template shown in FIGS. 9A and 9B covers more than half of the circuit. (The cover of two templates shown in FIG. 7 cannot be obtained, since our algorithm is restricted to tree and single-PO templates.) If the MFF heuristic is used, then the cover of three small templates-AND gate, CARRY and SUM functions, is obtained.

7. Applications of Template Generation

The following are some useful extensions of the above-described template generation algorithms.

Figure 11:
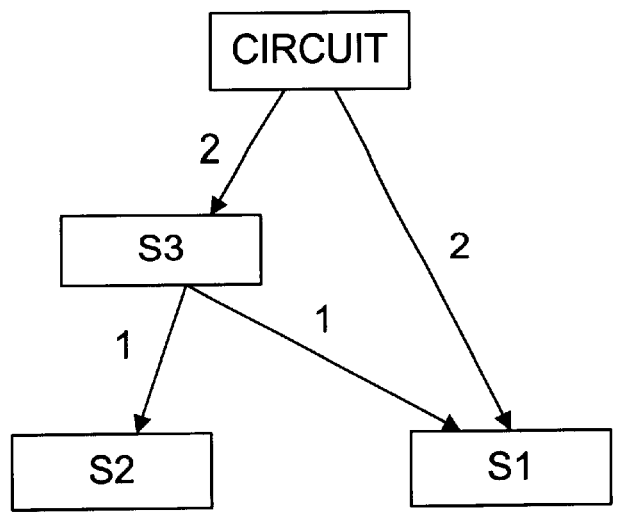
FIG. 11 illustrates a template hierarchy of the circuit of FIG. 1.

Hierarchical representation of regularity: Consider the two covers for the circuit graph of FIG. 1 generated by the extraction approach described above: one with two subgraphs of S3 and S1 each, and another one with two subgraphs of S2 and four of S1. The fact that S3 is composed of S1 and S2 is not captured by these two covers. We can compactly represent these two covers by identifying the hierarchy of templates. As describe above, in the case of tree templates, a template is stored hierarchically as a set of children templates. This notion of template hierarchy can be generalized. For a given G, every template is either hierarchically composed of other templates or is a leaf template. Let $S_1, \ldots, S_m$ be the templates in a cover generated by a regularity extraction approach, described above. The complete template hierarchy can be generated by recursively extracting the regularity from the graph composed of m independent subgraphs, $S_1, \ldots, S_m$, until we are left with leaf templates only. The templates in the two covers of FIG. 1 can be compactly represented by the hierarchy shown in FIG. 11. In general, any set of covers of G can be represented by a template hierarchy, which allows the user to select the most desirable cover for subsequent physical design stages.

Figure 12:
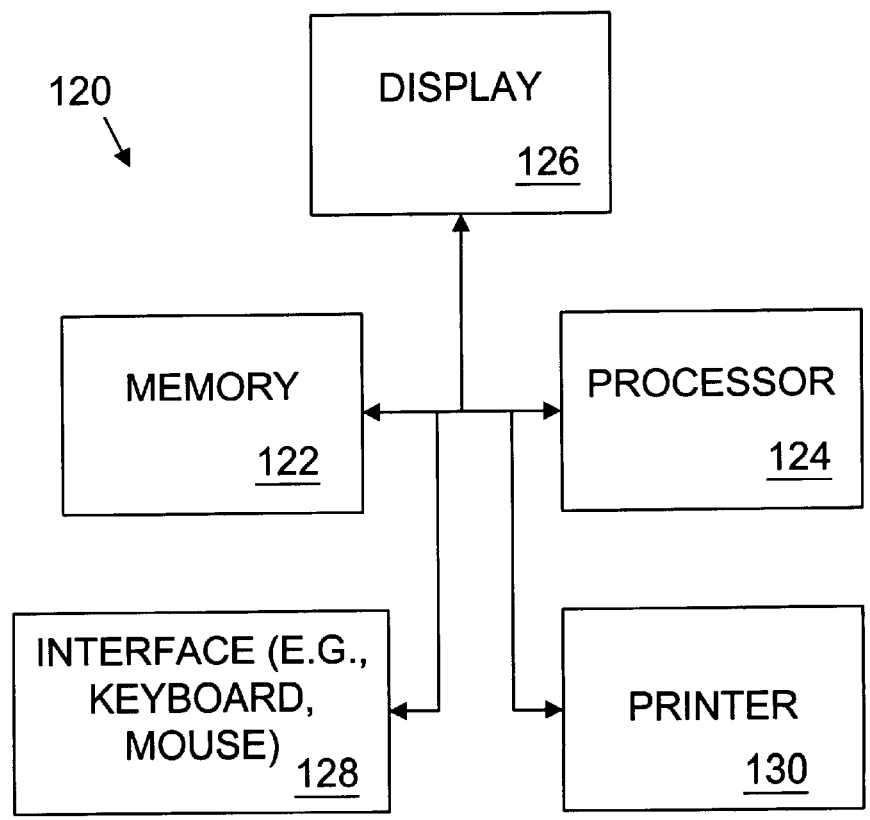
FIG. 12 illustrates a computer system that can be used in regularity extraction.

Referring to FIG. 12, a computer system 120 includes memory 122, processor 124, display 126, interface 128, and printer 130. In some embodiments, processor 116 executes a program from memory 122 that performs regularity extraction as described herein. Memory 122 may hold the descriptor language from which regularity is to be extracted, templates, different coverings, etc. The hierarchy of cover options can be presented, for example visually on display 126 or printed through printer 130. The user can select options through interface 128 (e.g., a keyboard or mouse). Memory 122 is intended as a generalized representation of memory and may include a variety of forms of memory, such as a hard drive, CD-ROM, and random access memory (RAM) and related circuitry. A hard drive, CD-ROM, and RAM are examples of articles including machine readable media. For example, the program performing the regularity extraction may be included on a CD-ROM and loaded from the CD-ROM to a hard drive. The high level description may be received, for example, on a disk or remotely through, for example, a modem.

Generating subgraphs for a user-given template: Given a template S', a template generation algorithm can be modified to identify all subgraphs of S' as well as its children templates. For example, if the user provides the template S3 for the circuit of FIG. 1, then all subgraphs of S3 as well as its children templates S1 and S2 can be generated. A user might also specify template S1 of FIG. 7. In some embodiments, the only modification to the template generation algorithm of Pseudocode Sample 1 is that the function Largest_Template (line 10) is called for every node-pair (vi, vj), where vi and vj belong to G and S', respectively. The covering can be easily generalized such that G is covered by a mix of user-specified and automatically-generated templates.

Figures 10A, 10B:
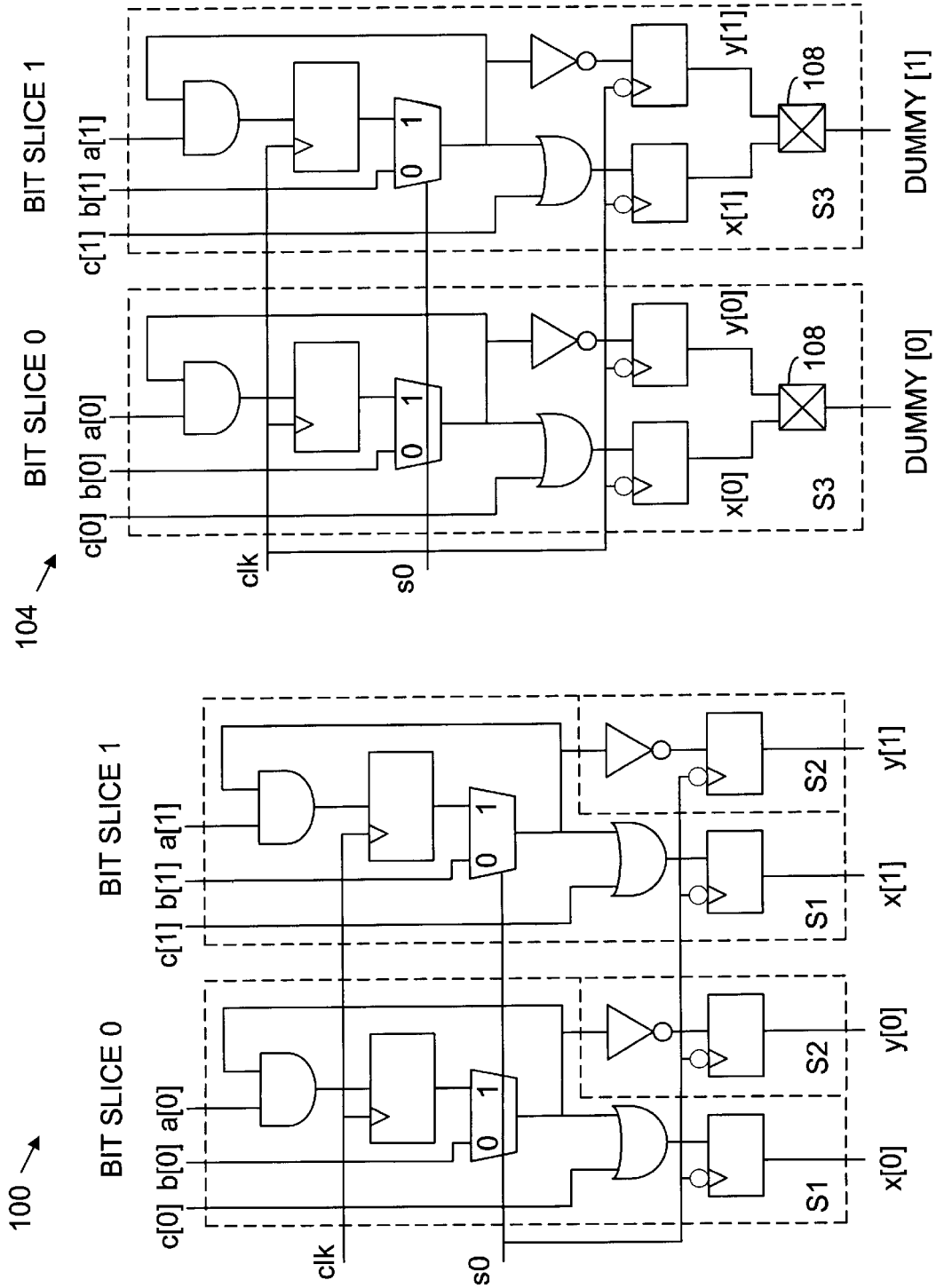
FIG. 10A illustrates a datapath circuit and a cover of two single-PO templates.
FIG. 10B illustrates a datapath circuit with a dummy node and a cover of a single template using a single dummy output bus.

General multi-output templates: Usually, the primary outputs of datapath circuits are specified by busses. The primary outputs can be group with the same bus index to form a dummy node, thus creating a dummy bus of the same width. A heuristic of adding a dummy output bus can be used such that a template generation algorithm finds a general multi-output template. For example, FIG. 10A illustrates a circuit 100 having bits slices 0 and 1 that are each by templates S1 and S2. As illustrated in FIG. 10B, circuit 100 can be modified to create a circuit 104 in which output busses x and y are grouped with a dummy node 108 so as to create a single dummy bus and a template S3 formed in place of S1 and S2. Each bit slice of circuit 104 can be covered by a single template S3. After the regularity has been extracted, the dummy bus [0] and dummy node 108 can be ignored at a later stage of design.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A method of regularity extraction, comprising:
generating a set of templates for a circuit through computer automated operations on a description of the circuit, wherein the set of templates includes single-principal output templates, where a single-principal output template is a template in which all outputs of the template are in the transitive fanin of a particular output of the template; and
covering the circuit with instances of a subset of the templates.

2. The method of claim 1, wherein the set of templates includes tree templates.

3. The method of claim 1, wherein the set of templates include tree templates and single-principal output templates.

4. The method of claim 1, wherein the set of templates is a complete set of templates under conditions including that the set of templates includes all maximal templates of a given class.

5. The method of claim 4, wherein the conditions also include that a template is not generated through permuting gate inputs.

6. The method of claim 1, wherein covering the circuit involves selecting one of the set of templates and meeting at least one of area, timing and power criteria and deleting all nodes in instances of the selected template.

7. The method of claim 6, wherein the covering further includes deleting templates in the set of templates other than the selected templates and regenerating a new set of templates from the remaining uncovered circuit.

8. The method of claim 1, wherein at least some of the templates of the set of templates are generated in part through recursion wherein a rootnode is joined to children nodes.

9. The method of claim 1, wherein covering involves using a largest-fit-first heuristic wherein a template with a largest area is selected.

10. The method of claim 1, wherein covering involves using a most-frequent-fit-first heuristic where a template with a maximum number of subgraphs is selected.

11. The method of claim 1, wherein a hierarchy of cover possibilities is presented to a user who can select among them.

12. The method of claim 1, wherein the set of templates is generated in part through determining largest templates.

13. The method of claim 1, wherein the set of templates is generated in part through determining equivalent templates.

14. The method of claim 1, wherein the circuit may include portions for which there is no template because there is a component that is not repeated.

15. The method of claim 1, wherein a user specifies some of the set of templates and the computer automated operations specify other of the set of templates.

16. A method of regularity extraction, comprising:
generating a set of templates for a circuit through computer automated operations on a description of the circuit, wherein the set of templates includes single-principal output templates; and
covering the circuit with instances of a subset of the templates.

17. The method of claim 16, wherein the set of templates is a complete set of templates under conditions including that the set of templates includes all maximal templates of a given class.

18. The method of claim 17, wherein the set of templates also includes tree templates.

19. An article of manufacture comprising:
a machine readable medium including instructions that when executed cause a computer to:
generate a set of templates for a circuit through computer automated operations on a description of the circuit, wherein the set of templates includes single-principal output templates, where a single-principal output templates is a template in which all outputs of the template are in the transitive fanin of a particular output of the template; and
cover the circuit with instances of a subset of the templates.

20. The article of manufacture of claim 19, wherein the set of templates is a complete set of templates under condition that the set of templates includes all maximal templates of a given class.

21. The article of manufacture of claim 19, wherein the set of templates includes more than one class of templates.

22. The article of manufacture of claim 21, wherein one class is a tree template.

23. An article of manufacture comprising:
a machine readable medium including instructions that when executed cause a computer to:
generate a set of templates for a circuit through computer automated operations on a description of the circuit, the set of templates includes single-principal output templates; and cover the circuit with instances of a subset of the templates.

24. A method of regularity extraction, comprising:

receiving a user specified template;

generating a set of templates for a circuit through computer automated operations on a description of the circuit, considering the user specified template, wherein the set of templates includes single-principal output templates, where a single-principal output templates is a template in which all outputs of the template are in the transitive fanin of a particular output of the template; and covering the circuit with instances of a subset of the templates.

25. A method of regularity extraction, comprising:

generating a set of templates for a circuit through computer automated operations on a description of the circuit, wherein the set of templates include a multiple-output template created through joining outputs in a dummy node; and covering the circuit with instances of a subset of the templates.

26. An article of manufacture comprising:

a machine readable medium including instructions that when executed cause a computer to perform a method including:

generating a set of templates for a circuit through computer automated operations on a description of the circuit, wherein the set of templates include tree templates and single-principal output templates; and covering the circuit with instances of a subset of the templates.

27. An article of manufacture comprising:

a machine readable medium including instructions that when executed cause a computer to perform a method including:

generating a set of templates for a circuit through computer automated operations on a description of the circuit, wherein the set of templates is a complete set of templates assuming at least that the set of templates includes all maximal templates of a given class; and covering the circuit with instances of a subset of the templates.

28. An article of manufacture comprising:

a machine readable medium including instructions that when executed cause a computer to perform a method including:

generating a set of templates for a circuit through computer automated operations on a description of the circuit, wherein; and covering the circuit with instances of a subset of the templates, wherein covering the circuit involves selecting one of the set of templates and meeting at least one of area, timing and power criteria and deleting all nodes in instances of the selected template.

* * * * *

UNITED STATES PATENT AND TRADEMARK OFFICE
CERTIFICATE OF CORRECTION

PATENT NO.    : 6,148,433
DATED         : November 14, 2000
INVENTOR(S)   : Chowdhary et al.

It is certified that error appears in the above-identified patent and that said Letters Patent is hereby corrected as shown below:

Column 2,
Line 16, delete "multiplexer." and insert -- multiplexer as used in conjuction with some embodiments of the present invention. --.
Line 18, delete "gate." and insert -- gate and shows a convention for u and v as used in conjunction with some embodiments of the present invention. --.

Column 10,
Line 32, delete "subraphs" and insert -- subgraphs --.

Signed and Sealed this

Seventeenth Day of September, 2002

Attest:

JAMES E. ROGAN
Attesting Officer
Director of the United States Patent and Trademark Office